(12) United States Patent
Takano

(10) Patent No.: US 7,830,740 B2
(45) Date of Patent: Nov. 9, 2010

(54) SEMICONDUCTOR MEMORY DEVICE HAVING SELECTABLE TRANSFER MODES

(75) Inventor: Susumu Takano, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 183 days.

(21) Appl. No.: 12/014,990

(22) Filed: Jan. 16, 2008

(65) Prior Publication Data

US 2008/0186796 A1   Aug. 7, 2008

(30) Foreign Application Priority Data

Feb. 7, 2007   (JP) .............................. 2007-027983

(51) Int. Cl.
*G11C 8/00*   (2006.01)
(52) U.S. Cl. ........................... 365/230.01; 365/230.06; 365/233.5; 365/189.12
(58) Field of Classification Search ............ 365/230.01, 365/230.06, 233, 189.12, 233.5
See application file for complete search history.

(56) References Cited

U.S. PATENT DOCUMENTS

| 5,086,407 | A | * | 2/1992 | McGarity et al. | .............. 710/21 |
| 5,636,174 | A | * | 6/1997 | Rao | ...................... 365/230.03 |
| 6,993,601 | B2 | * | 1/2006 | Minami et al. | ................ 710/38 |
| 7,102,958 | B2 | * | 9/2006 | Lee et al. | ................ 365/230.06 |
| 7,139,847 | B2 | * | 11/2006 | Park et al. | ...................... 710/14 |
| 7,310,717 | B2 | * | 12/2007 | Nishino et al. | .............. 711/165 |

FOREIGN PATENT DOCUMENTS

JP    11-328971 A    11/1999

* cited by examiner

*Primary Examiner*—Connie C Yoha
(74) *Attorney, Agent, or Firm*—Sughrue Mion, PLLC

(57) ABSTRACT

A semiconductor memory device includes a control circuit to control an access to a memory cell according to an input command, a transfer mode setting circuit to hold a transfer mode, an address pin input/output with an address in a first transfer mode and input/output with data in a second transfer mode and a switching circuit to switch a connection destination of the address.

14 Claims, 8 Drawing Sheets

| BALL | PIN NAME | COMMAND | ADDRESS | DATA | DATA MASK | STROBE |
|---|---|---|---|---|---|---|
| 1 | ADQ[00] | | A[00] | DQ[00] | | |
| 2 | ADQ[01] | | A[01] | DQ[01] | | |
| 3 | ADQ[02] | | A[02] | DQ[02] | | |
| 4 | ADQ[03] | | A[03] | DQ[03] | | |
| 5 | B[0] | | | | B[0] | |
| 6 | DQS[0] | | | | | DQS[0] |
| 7 | ADQ[04] | | A[04] | DQ[04] | | |
| 8 | ADQ[05] | | A[05] | DQ[05] | | |
| 9 | ADQ[06] | | A[06] | DQ[06] | | |
| 10 | ADQ[07] | | A[07] | DQ[07] | | |
| 11 | ADQ[08] | | A[08] | DQ[08] | | |
| 12 | ADQ[09] | | A[09] | DQ[09] | | |
| 13 | ADQ[10] | | A[10] | DQ[10] | | |
| 14 | ADQ[11] | | A[11] | DQ[11] | | |
| 15 | B[1] | | | | B[1] | |
| 16 | DQS[1] | | | | | DQS[1] |
| 17 | ADQ[12] | | A[12] | DQ[12] | | |
| 18 | ADQ[13] | | A[13] | DQ[13] | | |
| 19 | ADQ[14] | | A[14] | DQ[14] | | |
| 20 | ADQ[15] | | A[15] | DQ[15] | | |
| 21 | CLK | CLK | | | | |
| 22 | CMD_E | command_enable | | | | |
| 23 | #CLK | #CLK | | | | |
| 24 | ADQ[16] | | A[16] | DQ[16] | | |
| 25 | ADQ[17] | | A[17] | DQ[17] | | |
| 26 | ADQ[18] | | A[18] | DQ[18] | | |
| 27 | ADQ[19] | | A[19] | DQ[19] | | |
| 28 | DQS[2] | | | | | DQS[2] |
| 29 | CE2 | CE2 | | | B[2] | |
| 30 | ADQ[20] | | A[20] | DQ[20] | | |
| 31 | ADQ[21] | | A[21] | DQ[21] | | |
| 32 | ADQ[22] | | A[22] | DQ[22] | | |
| 33 | ADQ[23] | | A[23] | DQ[23] | | |
| 34 | DQ[24] | | | DQ[24] | | |
| 35 | CDQ[25] | #CAS | | DQ[25] | | |
| 36 | DQ[26] | | | DQ[26] | | |
| 37 | CDQ[27] | #CE1 | | DQ[27] | | |
| 38 | DQS[3] | | | | | DQS[3] |
| 39 | B[3] | | | | B[3] | |
| 40 | DQ[28] | | | DQ[28] | | |
| 41 | CDQ[29] | #RAS | | DQ[29] | | |
| 42 | DQ[30] | | | DQ[30] | | |
| 43 | CDQ[31] | #WE | | DQ[31] | | |

Fig. 2

| MODE | COMMAND | CLK | CMD_Enable | CE2 | /CE1 | /RAS | /CAS | /WE | Add |
|---|---|---|---|---|---|---|---|---|---|
| DESL | DESL | ↑ | L | H | H | X | X | X | X |
| READ ADDRESS LATCH | RAL | ↑ | L | H | L | L | H | H | V |
| WRITE ADDRESS LATCH | WAL | ↑ | L | H | L | L | H | L | V |
| BURST ADDRESS FORWARD | ABR/ABW | ↑ | H | H | L | H | H | H | X |
| BURST FORCED TERMINATION | BRT/BWT | ↑ | L | H | H | H | H | H | X |
| EXTERNAL REFRESH | EXR | ↑ | L | H | L | H | L | L | X |
| SELF REFRESH ENABLE | SER | ↑ | L | L | X | X | X | H | X |
| POWER DOWN MODE | POD | ↑ | L | H | L | H | L | H | X |
| REGISTER SET | MRS | ↑ | L | H | L | H | L | H | CODE |

Fig. 3

| BALL | PIN NAME | COMMAND | ADDRESS | DATA | DATA MASK | STROBE |
|---|---|---|---|---|---|---|
| 1 | ADQ[00] | | | DQ[00] | | |
| 2 | ADQ[01] | | A[00] | | | |
| 3 | ADQ[02] | | | DQ[02] | | |
| 4 | ADQ[03] | | A[01] | | | |
| 5 | B[0] | | | | B[0] | |
| 6 | DQS[0] | | | | | DQS[0] |
| 7 | ADQ[04] | | | DQ[04] | | |
| 8 | ADQ[05] | | A[02] | | | |
| 9 | ADQ[06] | | | DQ[06] | | |
| 10 | ADQ[07] | | A[03] | | | |
| 11 | ADQ[08] | | | DQ[08] | | |
| 12 | ADQ[09] | | A[04] | | | |
| 13 | ADQ[10] | | | DQ[10] | | |
| 14 | ADQ[11] | | A[05] | | | |
| 15 | B[1] | | | | | |
| 16 | DQS[1] | | A[06] | | | |
| 17 | ADQ[12] | | | DQ[12] | | |
| 18 | ADQ[13] | | A[07] | | | |
| 19 | ADQ[14] | | | DQ[14] | | |
| 20 | ADQ[15] | | A[08] | | | |
| 21 | CLK | CLK | | | | |
| 22 | CMD_E | command_enable | | | | |
| 23 | #CLK | #CLK | | | | |
| 24 | ADQ[16] | | | DQ[16] | | |
| 25 | ADQ[17] | | A[09] | | | |
| 26 | ADQ[18] | | | DQ[18] | | |
| 27 | ADQ[19] | | A[10] | | | |
| 28 | DQS[2] | | A[11] | | | |
| 29 | CE2 | CE2 | | | | |
| 30 | ADQ[20] | | | DQ[20] | | |
| 31 | ADQ[21] | | A[12] | | | |
| 32 | ADQ[22] | | | DQ[22] | | |
| 33 | ADQ[23] | | A[13] | | | |
| 34 | DQ[24] | | | DQ[24] | | |
| 35 | CDQ[25] | #CAS | | | | |
| 36 | DQ[26] | | | DQ[26] | | |
| 37 | CDQ[27] | #CE1 | | | | |
| 38 | DQS[3] | | | | | DQS[1] |
| 39 | B[3] | | | | B[1] | |
| 40 | DQ[28] | | | DQ[28] | | |
| 41 | CDQ[29] | #RAS | | | | |
| 42 | DQ[30] | | | DQ[30] | | |
| 43 | CDQ[31] | #WE | | | | |

Fig. 5

| MODE | COMMAND | CLK | CMD_Enable | CE2 | /CE1 | /RAS | /CAS | /WE | BA | AP (A10) | Add |
|---|---|---|---|---|---|---|---|---|---|---|---|
| DESL | DESL | ↑ | X | H | H | X | X | X | X | X | X |
| ROW ADDRESS LATCH | ACT | ↑ | X | H | L | L | H | H | V | V | V |
| WRITE COLUMN ADDRESS | WRIT | ↑ | X | H | L | H | L | L | V | L | V |
| WRITE COLUMN ADDRESS (AP) | WRITA | ↑ | X | H | L | H | L | L | V | H | V |
| READ COLUMN ADDRESS | READ | ↑ | X | H | L | H | L | H | V | L | V |
| READ COLUMN ADDRESS (AP) | READA | ↑ | X | H | L | H | L | H | V | H | V |
| PRECHARGE | PALL | ↑ | X | H | L | L | H | L | X | H | X |
| PRECHARGE SELECT BANK | PRE | ↑ | X | H | L | L | H | L | V | L | X |
| BURST ADDRESS FORWARD | ABR/ABW | ↑ | X | H | L | H | H | L | X | X | X |
| BURST STOP | BST | ↑ | X | H | L | H | H | L | X | X | X |
| EXTERNAL REFRESH | EXR | ↑ | X | H | L | L | L | H | X | X | X |
| REGISTER SET | MRS | ↑ | X | H | L | L | L | L | L | L | Code |

Fig. 6

|  | INDEPENDENT ADDRESS AND DATA PINS | SHARED ADDRESS AND DATA PINS | DIFFERENCE |
|---|---|---|---|
| ADDRESS PIN | 22 | 32 | 22 |
| DATA PIN | 32 | | |
| CLOCK PIN | 1 | 1 | 0 |
| COMMAND PIN | 9 | 9 | 0 |
| TOTAL | 64 | 42 | 22 |

Fig. 8

SEMICONDUCTOR MEMORY DEVICE HAVING SELECTABLE TRANSFER MODES

BACKGROUND OF THE INVENTION

1. Field of the Invention

The present invention relates to a semiconductor memory device, and particularly to a semiconductor memory device having a terminal combining an input terminal for address and an input/output terminal for data.

2. Description of Related Art

A semiconductor device is mounted to a cellular phone or the like. In a cellular phone or the like, data is transferred between a semiconductor memory device (hereinafter referred to as a memory) and other functional circuits such as CPU (Central Processing Unit). In recent years, the data transfer efficiency is desired to improve. One of the methods for the improvement in data transfer efficiency is to increase the number of buses connecting between the memory and CPU etc. This method increases the amount of data that can be transferred in one access by increasing the number of buses. On the other hand, in mobile devices such as a cellular phone provided with a memory, a package of a semiconductor device is desired to be miniaturized. An increase in the number of buses increases the number of pins formed in a memory. The increase in the number of pins is detrimental to the miniaturization of a memory.

Therefore, Japanese Unexamined Patent Application Publication No. 11-328971 (Choi) discloses to use the same pins for inputting/outputting a data signal and inputting an address signal.

The technique set forth by Choi discloses to input/output data through a pin for inputting addresses by inputting a particular control signal. However, the technique only discloses that a memory disclosed by Choi inputs/outputs data through a pin for address. Control of addresses for inputting and input of command to the memory are not taken into consideration for the memory disclosed by Choi. Moreover, Choi only discloses to switch an input of an address pin for an asynchronous memory.

On the other hand, there are memories in recent years that have a burst mode as in a synchronous DRAM (Dynamic Random Access Memory). In the burst mode, a memory carries out a specific operation when accessing the memory with different burst length or inputting a command to the memory.

When using an address terminal for inputting/outputting data in an asynchronous memory as the one disclosed by Choi, detailed access operations and command inputs to an address as in a SDRAM are not possible. On the other hand, in order to transfer a huge amount of data at a time, there has been a case where the number of pins for data input/output terminal is limited by an address terminal and a terminal for command input in a SDRAM or the like.

The present inventor has recognized that in the semiconductor memory device disclosed by Choi, if sharing a pin used for data input/output with an address pin, addresses and commands cannot be input through the address pin, thereby reducing the data transfer efficiency.

SUMMARY

In one embodiment, a semiconductor memory device includes a control circuit to control an access to a memory cell according to an input command, a transfer mode setting circuit to hold a transfer mode, an address pin input/output with an address in a first transfer mode and input/output with data in a second transfer mode and a switching circuit to switch a connection destination of the address pin according to the transfer mode.

This configuration enables a semiconductor memory device which inputs various commands to support mass transfer.

The semiconductor memory device according to the present invention improves data transfer efficiency, keeps the number of pins to the minimum and miniaturizes the semiconductor memory device.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 2 shows a detailed pin configuration of a mass transfer mode;

FIG. 3 shows commands that can be used in the mass transfer mode;

FIG. 5 shows a detailed pin configuration of a random transfer mode;

FIG. 6 shows commands that can be used in the random transfer mode;

FIG. 8 compares the number of pins in a memory of a related art and the present invention.

DETAILED DESCRIPTION OF PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Hereafter, this embodiment is described in detail with reference to the drawings. A semiconductor memory device (hereinafter referred to as a memory) of this embodiment has at least two operational modes. One of the operational modes (first transfer mode) supports sequential transfers in which a large amount of continuous data is input/output at once. The other mode (second transfer mode) is a random transfer operational mode in which a small amount of discrete data is input/output at random. The memory of this embodiment uses pins for inputting addresses as data input/output pins in the mode for transferring a large amount of data and operates in ×32 mode. In the operational mode for transferring data at random, only data input/output pins are used and operates in ×16 mode.

Figure 1:
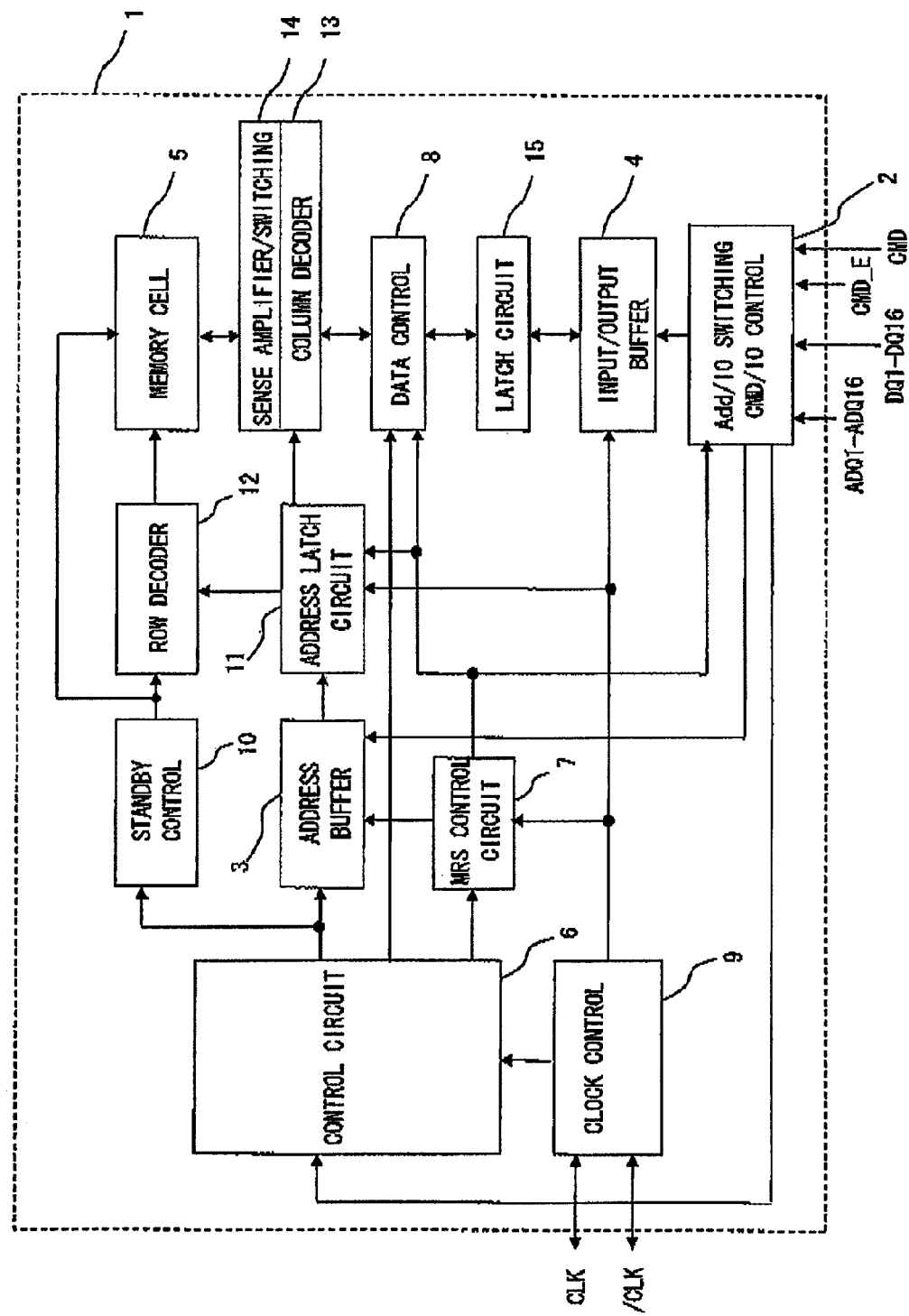
FIG. 1 is a block diagram showing a memory according to the present invention.

The block diagram of a SDRAM according to this embodiment is shown in FIG. 1. As shown in FIG. 1, a memory 1 of the SDRAM according to this embodiment includes a switching circuit (Add/IO and CMD/IO switching circuit) 2, an address buffer 3, an input/output buffer 4, a memory array 5, a control circuit 6, a mode setting circuit (Mode Register Set: hereinafter referred to as a MRS control circuit) 7, a data control unit 8, a clock control unit 9, a standby control unit 10, an address latch circuit 11, a row decoder 12, a column decoder 13 and a sense amplifier 14 and a latch circuit 15.

The switching circuit 2 is a circuit for switching a connection destination of pins for address input according to an output of the mode setting circuit 7. In this embodiment, the switching circuit switches the case when an address pin is connected with the address buffer 3 and the case when an address pin is connected with a memory cell through the input/output buffer. The address buffer 3 outputs an address signal provided through the switching circuit 2 and the control circuit 6 when an address is input to the address pin. The input/output buffer 4 is a buffer circuit for inputting/outputting data with outside the memory. The memory array 5 has a plurality of memory cells arranged in a matrix to store data.

The control circuit 6 controls operation of the memory of this embodiment according to a command input through the switching circuit 2. The control circuit 6 lets the MRS circuit 7 hold that it is a mass transfer when a command indicating of mass transfer is provided and also lets the MRS circuit 7 hold that it is a random transfer when a command indicating of random transfer is provided.

The MRS circuit 7 is a register for holding the operational mode of the memory and outputs a signal which controls operation of the memory according to the operational mode held there. The data control unit 8 is a circuit for selecting whether to output data in 32 bits output of ×32 mode or 16 bits output of ×16 mode. The clock control unit 9 outputs a control signal that synchronizes with a clock signal which is input externally to operate the memory. The standby control unit 10 stops operation of the memory when the memory is in standby status to be in a standby mode.

The address latch circuit 11 temporarily holds an address signal output by the address buffer 3. The row decoder 12 decodes a row address from the address signal held in the address latch circuit 11 and selects any row of the memory array. The column decoder 13 decodes the address signal held in the address latch circuit and selects any column of the memory array.

The sense amplifier 14 amplifies a value read from a memory cell in the memory array 5. The latch circuit 15 temporarily holds read-out data or write-in data.

Moreover, the memory 1 of this embodiment includes several kinds of pins. In this embodiment, these pins correspond to a plurality of address pins ADQ1 to ADQ16 in which address data or a data signal is input/output according to the operational mode of the memory, a plurality of data pins DQ1 to DQ16 in which data is input/output, a mode specification pin CMD_E in which a mode specification signal is input and a command pin CMD for inputting various commands to the memory. These pins are connected to the switching circuit 2 in the memory 1. In an actual memory formed of a semiconductor integrated circuit, there are pins for clock input, power supply input and data mask or the like other than these pins, however they are omitted here.

Operation of the memory 1 of the present invention formed as described above is explained hereinafter. As mentioned above, the memory 1 of this embodiment has the mode for transferring a large amount of data (hereinafter referred to as a mass transfer mode) and the mode to transfer a small amount data at random (hereinafter referred to as a random transfer mode).

In the mass transfer mode, a command indicating of the mass transfer mode is input externally to the memory 1 through the command pin CMD. The command indicating of the mass transfer mode is input to the control circuit 2 through the switching circuit 2. The control circuit 6 lets the MRS circuit 7 hold that it is the mass transfer mode according to the transfer mode indicated by the provided command. The MRS circuit 7 outputs a signal indicating of the mass transfer mode to the data control unit 8 and the switching circuit 2 if set to the mass transfer mode.

In the case of the mass transfer mode, the data control unit 8 is set to ×32 mode and inputs/outputs data which is input/output from/to the memory to/from the latch circuit 15 in ×32 mode.

The switching circuit 2 treats the address pins ADQ1 to ADQ16 as data pins when receiving a signal indicating of the mass transfer mode. That is, a signal input and output to the address pins ADQ1 to ADQ16 is exchanged through the input/output buffer 4, the latch circuit 15 and the data control unit 8, as with the signal input to the data pins DQ1 to DQ16.

On the other hand, in the random transfer mode, a command indicating of the random transfer mode is input externally to the memory 1 through the command pin CMD. The signal indicating of the random transfer mode is input to the control circuit 6 through the switching circuit 2. The control circuit 6 lets the MRS circuit 7 hold that it is the random transfer mode according to the signal provided. The MRS circuit 7 outputs a signal indicating of the random transfer mode to the data control unit 8 and the switching circuit 2 if set to the random transfer mode.

In the case of the random transfer mode, the data control unit 8 is set to ×16 mode and inputs/outputs data which is input/output from/to the memory to/from the latch circuit 15 in ×16 mode.

When receiving the signal indicating of the random transfer mode, the switching circuit 2 inputs the signal provided to the address pins ADQ1 to ADQ16 into the address buffer 3 as data indicating an address of the memory. In the random transfer mode, the memory 1 accesses a memory cell according to an address through the address buffer 3 and the address latch circuit 11.

With such configuration, by setting to the mass transfer mode when transferring a large amount of data, it is possible to transfer a large amount of data in ×32 mode using the address pins ADQ1 to ADQ16 without using complicated commands.

On the other hand, if an access to a memory becomes complicated, a complicated command using a part of the address pins ADQ can be input as a SDRAM. In the random transfer mode, it is possible to input/output in ×16 mode as a SDRAM while enabling a more detailed access to the memory 1.

Operation of this embodiment according to the present invention is explained hereinafter with reference to a more detailed example. Here, a memory having a configuration of 512M×32 bit is explained as an example.

The pin configuration at the time of the mass data transfer mode is shown in FIG. 2. In the pin configuration shown in FIG. 2, the abovementioned pins operating as address pins and data pins are indicated as ADQ[00] to ADQ[23] and the data pins are indicated as DQ[24] to DQ[30]. Moreover, the mode specification pin CMD_E which supports the transfer mode is equivalent to a command enable CMD_E. The example shown in FIG. 2 illustrates a data mask pin B which inputs a signal for masking input/output data in accordance with the actual operation of the memory 1, a data strobe pin DQS which inputs a signal for adjusting an input/output timing of data, a clock signal input pin CLK and #CLK, a pin CDQ operating for command input and data input/output of a SDRAM and a chip enable pin CE.

In the case of a memory device of a related art that is able to operate as a SDRAM with 512×32 bit configuration, the number of necessary pins is; 22 address pins, 32 data pins, 1 clock pin and 9 command pins. The memory device of a related art requires at least 32 data pins to output in ×32 mode. Thus the 512M×32 bit memory device requires at least 64 pins.

On the other hand, in this embodiment, after letting the MRS circuit hold that it is the mass transfer mode through the command pin, by providing a signal of a specified level (for example L level) to the mode specification pin, the switching circuit 2 switches input/output of the address pin to data input/output. Therefore, with 32 pins combining the address pins and data pins, it is possible to output in ×32 mode.

Figure 4:
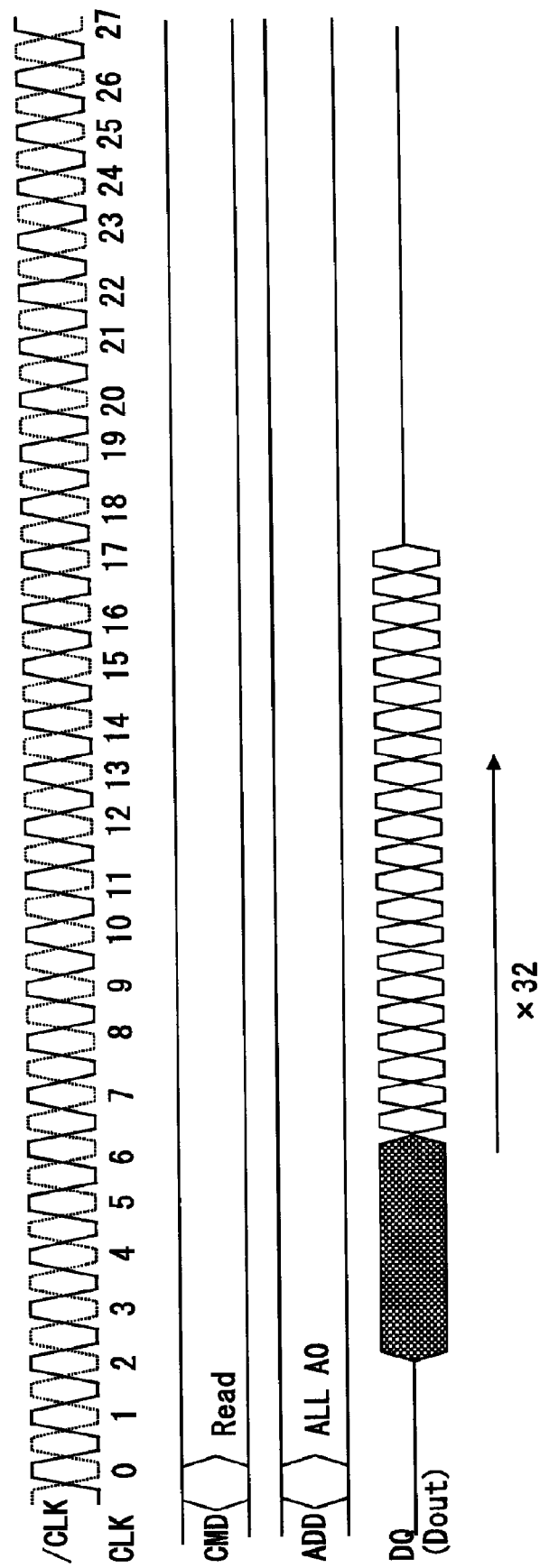
FIG. 4 is a timing chart showing an access to a memory in the mass transfer mode.

Accordingly, it becomes possible to input and output data in ×32 mode with 43 pins as shown in FIG. 2. The command that can be input to the memory in this case are shown in FIG. 3. The timing chart of an access to the memory is shown in FIG. 4.

As shown in FIG. 3, when using in the mass transfer mode, the number of commands that can be input to the memory 1 is smaller than the SDRAM with 512M×32 bit configuration. However, in case of inputting/outputting a large amount of continuous data, a first address to be read out may be input once before inputting/outputting data as shown in FIG. 4, and then after that, it is possible to transfer data at high speed in ×32 mode.

Figure 7:
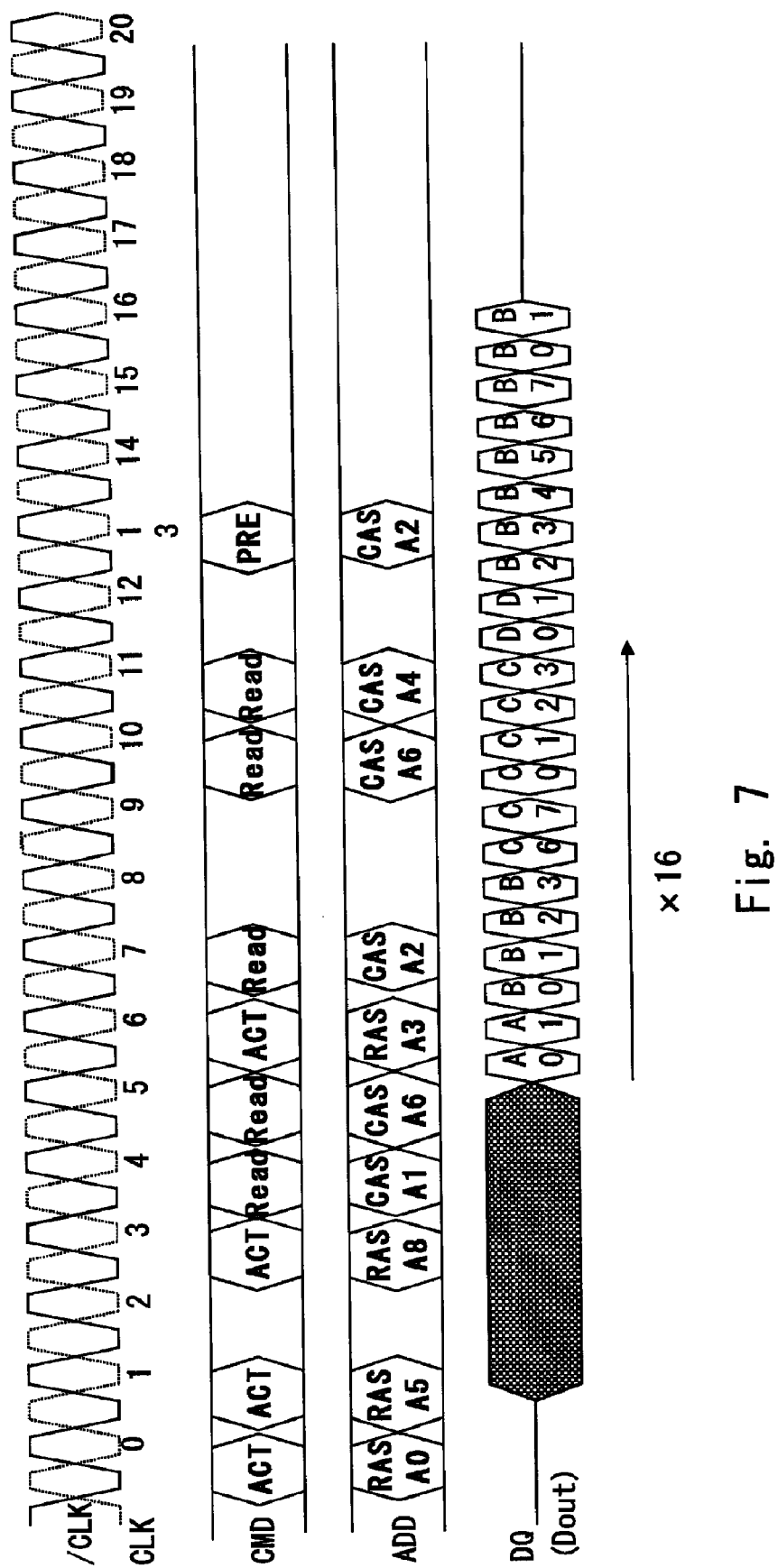
FIG. 7 is a timing chart showing an access to a memory in the random transfer mode.

FIG. 5 shows the pin configuration of the random transfer mode. The control circuit 6 lets the MRS circuit hold the value when the command indicating of the random transfer mode is input and the switching circuit 2 switches an input to each pin as shown in FIG. 5. The commands that can be used in this random transfer mode are shown in FIG. 6. If set to the random transfer mode as shown in FIG. 6, it becomes possible to access to a memory cell by bank. Therefore, as shown in FIG. 7, a command and an address are input to access the memory according to the input address and then data is input/output.

As described above, in this embodiment, by providing a mode for inputting/outputting data through the address pins and enabling to use the address pins for inputting/outputting addresses and data in response to a command input externally, it is possible to perform a mass transfer without increasing the number of pins in the memory. As shown in FIG. 8, in the memory of 512M×32 bit, for example, 22 pins can be reduced. Moreover, in the mode to use the address pin as an address pin for its original use, as with a SDRAM of a related art, it is possible to perform detailed accesses using various commands.

Although it is explained in detail according to the embodiment of the present invention, the present invention is not limited to the above embodiment but various modifications can be made. For example, the pin configurations shown in FIGS. 2 to 7 can be changed as appropriate according to the specification and the capacity of the target memory device. Moreover, in more detailed explanation, a mode is set by a command for specifying the mode and the address pins in the switching circuit are switched to the data pins by the mode specification pin. However the switching circuit may change the address pins to pins for inputting/outputting data by an output of the MRS circuit and the mode specification pin is not necessarily required. Furthermore, as long as it is the configuration for switching the address pins to the pins for data input/output by the mode specification pin, a predetermined value is held in the MRS circuit by the mode specification pin, and the mode is not necessarily specified by a command input.

It is apparent that the present invention is not limited to the above embodiments, but may be modified and changed without departing from the scope and spirit of the invention.

What is claimed is:

1. A semiconductor memory device comprising:
   a control circuit which controls access to a memory cell according to an input command;
   a transfer mode setting circuit which holds a transfer mode, by which a transfer manner of data stored or to be stored in the memory cell is determined, according to a command from the control circuit;
   an address pin which inputs an address in a first transfer mode and inputs or outputs data in a second transfer mode;
   a data pin which inputs or outputs data in both the first and second transfer modes;
   a switching circuit which switches a connection destination of the address pin between an address buffer and an input/output buffer according to the transfer mode; and
   a data controller which processes data such that said data is to be transferred through the data pin or through both the address pin and the data pin according to the transfer mode, wherein
   the data controller outputs first data such that said first data is to be transferred through the data pin in the first transfer mode, and outputs second data such that said second data is to be transferred through both the data and address pins in the second transfer mode.

2. The semiconductor memory device according to claim 1, wherein the control circuit outputs a signal which specifies the first transfer mode or the second transfer mode to the transfer mode setting circuit according to an input command.

3. The semiconductor memory device according to claim 1, wherein the semiconductor memory device is a synchronous semiconductor memory device.

4. The semiconductor memory device according to claim 2, wherein the semiconductor memory device is a synchronous semiconductor memory device.

5. The semiconductor memory device according to claim 1, further comprising a mode specification pin for specifying a connection destination of the address pin, the address pin being connected with the switching device.

6. The semiconductor memory device according to claim 2, further comprising a mode specification pin for specifying a connection destination of the address pin, the address pin being connected with the switching device.

7. The semiconductor memory device according to claim 3, further comprising a mode specification pin for specifying a connection destination of the address pin, the address pin being connected with the switching device.

8. A memory device comprising:
   a transfer mode setting circuit which holds a transfer mode, by which a transfer manner of data stored or to be stored in a memory cell is determined, according to a command;
   a plurality of data input/output pins which input or output data in both first and second transfer modes;
   a plurality of data address pins which input an address in the first transfer mode and input or output data in the second transfer mode; and
   a switching circuit which switches the connection destination of the plurality of data address pins between an address buffer and an input/output buffer according to the transfer mode; and
   a data controller which processes data such that said data is to be transferred through the data pin or through both the address pin and the data pin according to the transfer mode, wherein
   the data controller outputs first data such that said first data is to be transferred through the data pin in the first transfer mode, and outputs second data such that said second data is to be transferred through both the data and address pins in the second transfer mode.

9. The memory device according to claim 8, wherein the switching circuit switches the function of the plurality of data address pins in accordance with a mode setting command.

10. The semiconductor memory device according to claim 1, wherein
the data controller is coupled between the input/output buffer and the memory cell.

11. The semiconductor memory device according to claim 1, wherein
the data controller is coupled to the address pin and the data pin through the input/output buffer.

12. The semiconductor memory device according to claim 1, wherein
the first transfer mode is a random transfer mode, and the second transfer mode is a mass transfer mode.

13. The semiconductor memory device according to claim 1, further comprising:
a pin through which the input command is input to the semiconductor memory device.

14. The semiconductor memory device according to claim 1, wherein
the switching circuit connects the address pin with the address buffer in the first transfer mode, and connects the address pin with the input/output buffer in the second transfer mode.

* * * * *